United States Patent [19]

Salerno et al.

[11] Patent Number: 5,168,182

[45] Date of Patent: Dec. 1, 1992

[54] 0-100% DUTY CYCLE, TRANSFORMER ISOLATED FET DRIVER

[75] Inventors: David C. Salerno, New Hartford; Walter O. Roberts, East Granby, both of Conn.

[73] Assignee: United Technologies Corporation, Hartford, Conn.

[21] Appl. No.: 720,108

[22] Filed: Jun. 24, 1991

[51] Int. Cl.$^5$ .................. H03K 17/687; H03K 5/01; H03K 5/13

[52] U.S. Cl. .................. 307/571; 307/261; 307/269

[58] Field of Search ............ 307/571, 584, 296.3, 307/253, 254, 270; 323/285; 363/56, 261, 269

[56] References Cited

U.S. PATENT DOCUMENTS

| | | | |
|---|---|---|---|
| 4,201,928 | 5/1980 | Koetsch | 307/270 |
| 4,471,422 | 9/1984 | Hierholzer, Jr. | 363/56 |
| 4,634,903 | 1/1987 | Montorfano | 307/571 |
| 4,709,161 | 11/1987 | Mizohata et al. | 307/270 |

Primary Examiner—Janice A. Howell
Assistant Examiner—Sinh Tran
Attorney, Agent, or Firm—Richard H. Kosakowski

[57] ABSTRACT

A transformer isolates a control circuit from a FET, the control circuit including a clock generator for providing, when enabled, a clock signal to the transformer primary. A PWM input selectively disables the clock generator from providing the clock signal to the transformer primary. The transformer secondary is connected in a full wave centertap configuration for providing a full wave rectified version of the clock signal, the full wave rectified version being a relatively constant DC voltage signal supplied at one level to the FET to turn on the FET when the clock generator is enabled to provide the clock signal to the primary. The centertap configuration provides a relatively constant DC voltage signal at a second level to the FET to turn off the FET when the clock generator is disabled by the PWM input from providing the clock signal to the primary.

12 Claims, 2 Drawing Sheets

0-100% DUTY CYCLE, TRANSFORMER ISOLATED FET DRIVER

DESCRIPTION

1. Technical Field

This invention relates to transistor drive circuits, and more particularly to driving a transistor with a pulse width modulated (PWM) signal having a duty cycle of from 0 to 100%.

1. Background Art

Power Field Effect Transistor (FET) devices (e.g., Metal Oxide Semiconductor FETs—MOSFETs) are used to control the power delivered to loads such as, e.g., motors and transformers. The control method is usually PWM or some form of pulse modulation. This requires that the power device be switched ON and OFF quickly to minimize power loss in the linear conduction region. Power MOSFETs are ideal in this application due to their high switching speeds, low conduction losses, low drive power requirements, and high power handling capability.

To provide the full range of power control (0 to 100%), it is necessary for the power device to be driven at any duty cycle (the ratio of ON time to ON+OFF time) from 0 to 100%.

Since the power FET may be located in a high voltage circuit or in series with the high voltage side of a power line, a drive circuit for the FET is often required to provide electrical isolation between the FET and the controlling circuit, such as a microprocessor or discrete digital logic. Two common electrical isolation drive techniques are optocoupler and transformer. Optocoupler drivers use an optocoupler to provide electrical isolation between the control circuit and the power device. The control circuit drives a light emitting diode (LED) within the optocoupler, the photons emitted create a current in an isolated output transistor which is amplified and used to drive the FET.

A major drawback to the optocoupler is that the output transistor requires a power source. Thus, an isolated voltage must be provided which is referenced to the FET circuit, creating another isolation problem. Further, multiple drivers in different circuits require multiple isolated sources. In addition, optocouplers experience an aging effect wherein the input to output current gain degrades over time, requiring excessive drive current to guarantee performance over the long term.

On the other hand, transformer coupled drivers typically use a small pulse transformer to provide electrical isolation. The control circuit drives the transformer primary and the secondary is connected to the power FET. This method can produce fast switching times, but also has a major drawback. As the duty cycle of the control input is varied, the amplitude of the secondary drive voltage will vary due to the constant volt-time product of the transformer. The resultant FET drive voltage is not constant and the useable control range is much less than 0 to 100%.

There are schemes to correct this limitation, but all require more hardware and have other problems. One such scheme is to turn the FET ON with one polarity pulse from a transformer, and turn it OFF with another pulse of the opposite polarity. The capacitance of the FET gate is used to retain the charge between drive pulses, thereby achieving 0 to 100% duty cycle control and providing a constant drive amplitude. The drawback of this, besides the added circuit complexity, is that the impedance of the gate circuit is high when not being pulsed. Noise coupled to the gate of the FET can turn it ON or OFF at the wrong time, causing malfunction.

Further, a push-pull transformer drive technique gives a constant drive amplitude, but is limited to a maximum duty cycle of 50%.

DISCLOSURE OF INVENTION

Objects of the present invention include provision of a circuit for driving a FET or other transistor types (e.g., bipolar) with a PWM signal having a duty cycle in the range of from 0 to 100%, thereby allowing for a 0 to 100% range of power delivery by the transistor to a load such as a motor or transformer.

According to the present invention, a transformer isolates a control circuit from a power device such as a FET, the control circuit including a clock generator for providing, when enabled, a clock signal to the transformer primary, a PWM signal selectively disables the clock generator from providing the clock signal to the transformer primary, the transformer secondary being connected to circuitry of a full wave centertap configuration for providing a full wave rectified version of the clock signal, the full wave rectified version being a relatively constant DC voltage signal at one level fed to the FET to turn on the FET when the clock generator is enabled to provide the clock signal to the primary, the centertap configuration providing a relatively constant DC voltage signal at a second level to the FE to turn off the FET when the clock generator is disabled by the PWM input from providing the clock signal to the primary.

The 0 to 100% duty cycle drive for the FET is achieved by the present invention by the combination of the clock signal and the PWM input together with the full wave centertap configuration of the transformer secondary. That is, the ON time of the duty cycle is determined when the clock generator is enabled to provide the clock signal to the primary. Further, the OFF time of the duty cycle is determined when the clock generator is disabled by the PWM input from providing the clock signal to the primary.

The present invention has utility in providing for a relatively high degree of input to output isolation between the control circuit and the FET, relatively high switching speeds (less than 10 usec), 0 to 100% duty cycle control, small parts count and power requirement, low drive impedance for good noise immunity, and a FET DC voltage drive level that is both independent of duty cycle and is TTL/CMOS logic family compatible. Also, no isolated supplies are required, thereby saving printed circuit board space.

These and other objects, features and advantages of the present invention will become more apparent in light of the detailed description of an exemplary embodiment thereof, as illustrated in the accompanying drawings.

BEST MODE FOR CARRYING OUT THE INVENTION

Figure 1:
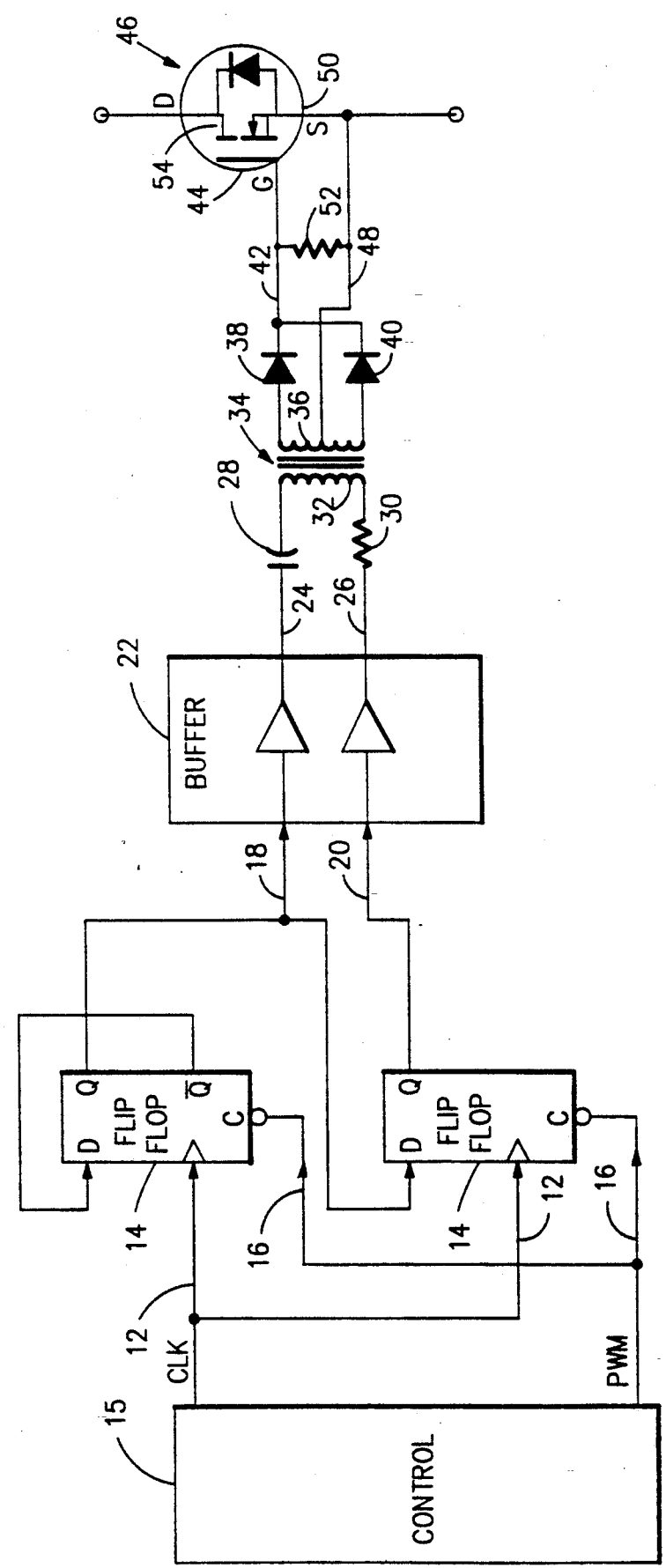
FIG. 1 is a schematic illustration of circuitry in accordance with the present invention.

Referring to FIG. 1, a clock signal, CLK, on a line 12 is input to the clock input of each stage of a dual flip-flop or D-type latch 14. The flip-flop 14 may be a CMOS device, identical to the Model 74HC74, provided by Motorola or National Semiconductor. The clock may be provided by control circuitry 15 implemented, e.g., on a gate array. The control circuitry 15 may comprise, e.g., a microprocessor or discrete digital logic. A second signal, PWM, from the control circuitry is provided on a line 16 to the clear input of each stage of the flip-flop.

The flip-flop is configured as a divide by two circuit, producing two square wave signal outputs on lines 18,20. When the PWM signal is logic HI, the flip-flop outputs have equal frequency and duty cycle (50%) and are 180 degrees out of phase with each other. When PWM is logic LO, both flip-flop outputs stop switching and are LO.

The two flip-flop outputs on the lines 18,20 are fed to a dual buffer 22 which provides current-amplified signals on the lines 24,26. The buffer 22 may either invert or non-invert the applied flip-flop output signals. The buffer outputs 24,26 typically range from +V (i.e., the buffer supply voltage) to 0V (ground). However, it is to be understood that the use of a buffer is not required for the broadest scope of the present invention. The buffer requirements are strictly application dependent, and the buffer is illustrated only as an example of one possible way of interfacing the flip-flop output signals to the remainder of the circuitry of the present invention, described hereinafter.

The buffer outputs are fed through a capacitor 28 and first resistor 30 to a primary winding 32 of a pulse transformer 34. A secondary winding 36 of the transformer 34 is connected through two diodes 38,40 configured as a full wave centertap rectifier. The cathodes of the diodes are tied together and connected by a signal line 42 to the gate (G) 44 of a MOSFET 46. The centertap of the transformer is connected by a line 48 to the source (S) 50 of the MOSFET. The MOSFET is an example of a device which may be used to switch power to a load, e.g., a motor or transformer (not shown). A second resistor 52 is connected across the gate 44 and source 50.

The first resistor 30 limits the peak current in the primary 32 resulting from transformer winding capacitance and load capacitance. The value of the first resistor affects the turn-on time of the MOSFET such that the lower the value, the shorter the turn-on time. A value of 500 Ohms yielded a turn-on time of 1.0 usec in a test circuit. The value of the first resistor also affects the drive voltage at the gate of the MOSFET by forming a resistive voltage divider with the second resistor 52.

The capacitor 28 prevents the saturation of the transformer core by blocking DC current from flowing into the primary 32. Saturation may occur if there exists significant unbalance in the amplitudes of the buffer output signals 24,26. A typical value for the capacitor is 0.1 uf. Its impedance at the frequency of the flip-flop output signals 18,20 should be kept low compared to that of the first resistor 30.

The transformer 34 provides electrical isolation between the flip-flop 14 and the MOSFET 46 and may also step the voltage level at the primary up or down. To reduce power consumption, the transformer's magnetizing current should be kept relatively low (less than 5.0 ma in a test circuit).

The diodes 38,40 are fast recovery types, typically the commonly available Model 1N4148. The diodes rectify the square wave output of the transformer secondary 36, producing a relatively constant MOSFET gate drive DC voltage on the line 42 to bias the MOSFET ON. Any dropout of this voltage (typically only tens of nanoseconds in duration) caused by buffer rise and fall times or gate delays will be filtered by the input gate capacitance of the MOSFET.

The second resistor 52 turns the MOSFET OFF when the PWM input to the flip-flop is LO by discharging the MOSFET gate capacitance. Also, the second resistor affects the drive voltage applied to the gate 44 by forming a voltage divider with the first resistor 30. A speed/power trade-off can be made in the selection of the value of the second resistor. A large value (around 5K ohms) will produce relatively slow turn-off times for the MOSFET, but will only require 2.0 ma of current to bias the MOSFET ON. Lowering the resistor value will reduce the MOSFET turn-off time, but will require more current from the primary supply, +V. In a test circuit, the value of the second resistor was 2K ohms, which produced a MOSFET turn-off time of 4.0 usec. Total driver power consumption was only 125.0 mw with a frequency of the CLK signal 12 at the flip-flop inputs of 100 Khz and a PWM input frequency of 5 Khz.

Note that the MOSFET turn-on and turn-off times will depend not only on the values of the first and second resistors, but also on the total gate capacitance of the MOSFET and the magnitude of the MOSFET drain (D) 54—source voltage swing due to the Miller effect.

Figure 2:
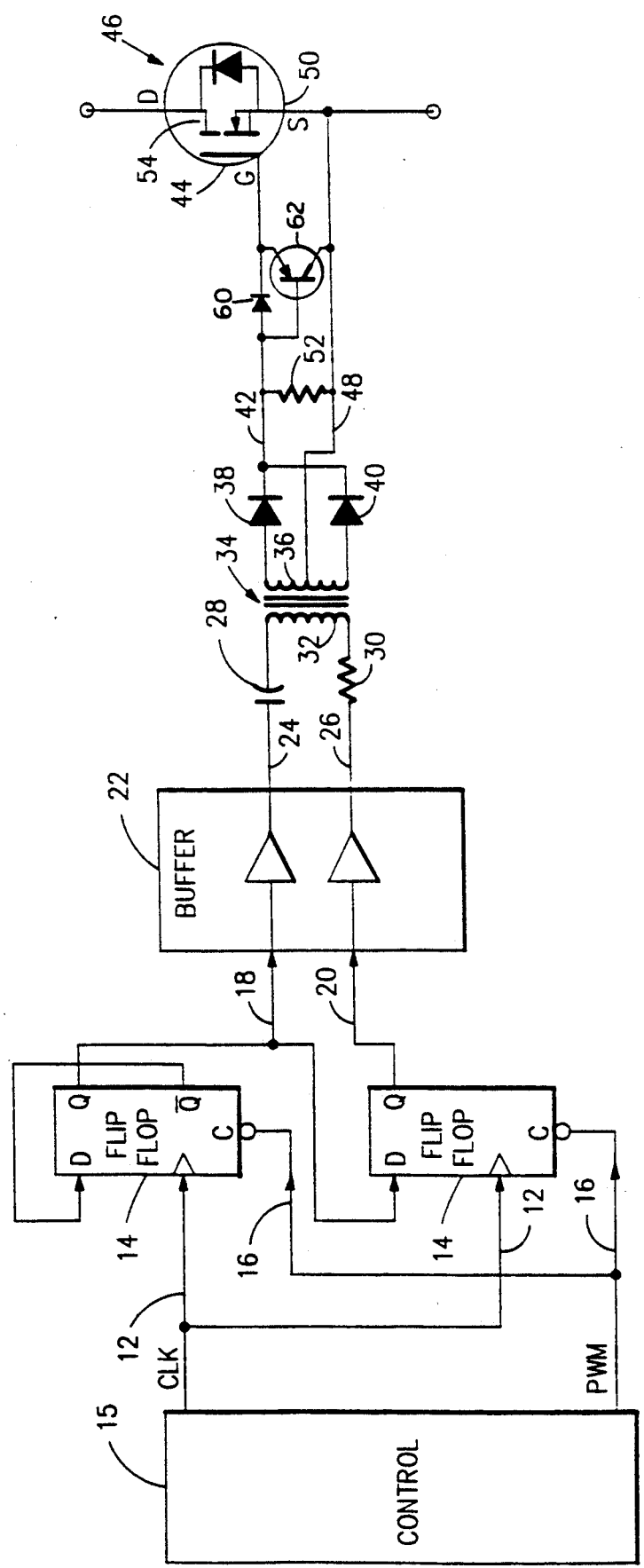
FIG. 2 is a schematic illustration of the circuitry of FIG. 1 with additional circuitry.

MOSFET turn-off times can be significantly reduced (under 1.0 usec) with the addition of an active turn-off circuit illustrated in FIG. 2. The additional elements beyond those in FIG. 1 are a third diode 60 and a PNP bipolar transistor 62. The additional circuitry will not increase drive power requirements.

The operation of the invention is best understood by example. The control circuitry 15 provides the square wave CLK signal 12 at a high frequency, typically 100 to 200 kHz. The high frequency reduces required transformer size. The flip-flop 14 divides this signal by two and provides the two outputs out of phase to the buffer 22 and then to the transformer primary 32. The control circuitry provides the PWM signal 16 at logic HI. The two diodes 38,40 rectify the square wave at the transformer secondary 36 to provide a DC voltage at the gate 44 of the MOSFET 46. The FET drive amplitude is relatively constant, determined by the buffer supply voltage, transformer turns ratio and resistor ratios. The MOSFET then turns on and switches power to the desired load device (e.g., motor or transformer).

When the control circuitry asserts the PWM input LO, the flip-flop outputs are disabled and both go to logic LO. Thus, with zero voltage applied to the transformer primary, there is zero voltage at the transformer secondary and at the MOSFET gate. The MOSFET is off and no power is conducted to the desired device.

It can be seen from the foregoing that the logic level of the PWM input controls the switching of power by the MOSFET such that the duty cycle of the PWM signal equals the duty cycle of the MOSFET device. Further, since a relatively constant DC voltage is applied to the MOSFET gate to turn it on, the circuit of the present invention overcomes the shortcomings of prior art transformer drivers in that full 0 to 100% duty cycle control is possible.

It has been illustrated that the power device to be driven in accordance with the present invention is a MOSFET. However, it is to be understood that the device could be an N or P channel MOSFET, or FET or similar device, such as an Insulated-Gate Bipolar Transistor (IGBT), without departing from the spirit and scope of the present invention. The device may even comprise a bipolar transistor; however, for use with such device some of the circuitry may have to be modified to provide the higher turn on current required and to accommodate the slower switching speeds.

Further, the clock signal, CLK, and PWM signal are described as being provided by known circuitry residing on a gate array. However, some or all of the circuitry of FIGS. 1 and 2 may also, if desired, be implemented on the gate array by one of ordinary skill in the art. Conversely, CLK and PWM along with the circuitry of FIGS. 1 and 2 may reside instead in discrete circuitry located on a printed circuit board. It is irrelevant to the practicing of the present invention as to the residence of the circuitry of FIGS. 1 and 2.

It has been illustrated that the clock signal is generated with a dual flip-flop. However, this scheme is purely exemplary; any other method of generating the clock signal along with a means for easily disabling this signal may be used in keeping with the broadest scope of the present invention.

Although the invention has been shown and described with respect to a best mode embodiment thereof, it should be understood by those skilled in the art that the foregoing and various other changes, omissions, and additions in the form and detail thereof may be made therein without departing from the spirit and scope of the invention.

We claim:

1. Apparatus, comprising:
    control means, for providing a repetitive time varying clock signal having a selected frequency, and for providing a disable signal having binary logic states;
    clock means, responsive to said clock signal and said disable signal, for providing a pair of square wave signals on a corresponding pair of signal lines when said disable signal is at a first one of said binary logic states, said pair of square wave signals being in an inverse phase relationship to each other, and for providing on each one of said corresponding pair of signal lines a constant DC voltage signal when said disable signal is at a second one of said binary logic states;
    a transformer, having a primary winding and a secondary winding, a first one of said corresponding pair of signal lines being coupled to one end of said primary winding, a second one of said corresponding pair of signal lines being coupled to a second end of said primary winding;
    full wave rectifier means, connected to said transformer secondary winding, for rectifying said pair of square wave signals and for providing as a result of said rectifying a rectified DC voltage signal at a first level, and for providing said rectified DC voltage signal at a second level when said disable signal is at said second one of said binary logic states; and
    transistor means, for conducting electrical current therethrough when said rectified DC voltage signal is at said first DC voltage level, and for not conducting electrical current therethrough when said rectified DC voltage signal is at said second DC voltage level.

2. The apparatus of claim 1, further comprising:
    buffer means, connected between said corresponding pair of signal lines and said ends of said transformer primary, for amplifying the current level of said pair of square wave signals and said pair of constant DC voltage signals.

3. The apparatus of claim 1, wherein said transistor means comprises a Metal Oxide Semiconductor Field Effect Transistor device.

4. The apparatus of claim 1, wherein said transistor means comprises a Field Effect Transistor device.

5. The apparatus of claim 1, wherein said transistor means comprises a bipolar transistor device.

6. The apparatus of claim 1, wherein said full wave rectifier means comprises a pair of diodes, an anode terminal of a first one of said pair of diodes being connected to a first end of said transformer secondary winding, a cathode terminal of said first one of said pair of diodes being connected to a first terminal of said transistor means, an anode terminal of a second one of said pair of diodes being connected to a second end of said transformer secondary winding, a cathode terminal of said second one of said pair of diodes being connected to said first terminal of said transistor means.

7. The apparatus of claim 1, wherein said clock signal comprises a square wave signal.

8. The apparatus of claim 1, wherein said clock means comprises a pair of flip-flops responsive to said clock signal.

9. Apparatus for isolating a control circuit from a power device, the apparatus allowing for turn-on/turn-off operation of the power device in the full range of from 0 to 100%, the apparatus comprising:
    means for providing a pair of square wave signals on a corresponding pair of signal lines when a disable signal is at a first binary logic state, said pair of square wave signals being in an inverse phase relationship to each other, and for providing on each one of said corresponding pair of signal lines a constant DC voltage level when said disable signal is at a second binary logic state;
    a transformer, having a primary winding and a secondary winding, a first one of said corresponding pair of signal lines being coupled to one end of said primary winding, a second one of said corresponding pair of signal lines being coupled to a second end of said primary winding; and
    full wave rectifier means, connected to said transformer secondary winding, for rectifying said pair of square wave signals and for providing a constant DC voltage signal at a first DC voltage level to turn on the power device for conducting electrical current therethrough, and for providing said constant DC voltage signal at a second DC voltage level when said disable signal is at said second one of said binary logic states to turn off the power device to prevent the power device from conducting electrical current therethrough.

10. The apparatus of claim 9, further comprising:
    buffer means, connected between said corresponding pair of signal lines and said ends of said transformer primary, for amplifying the current level of said pair of square wave signals and said pair of constant DC voltage levels.

11. The apparatus of claim 9, wherein said full wave rectifier means comprises a pair of diodes, an anode terminal of a first one of said pair of diodes being connected to a first end of said transformer secondary winding, a cathode terminal of said first one of said pair of diodes being connected to a first terminal of said transistor means, an anode terminal of a second one of said pair of diodes being connected to a second end of said transformer secondary winding, a cathode terminal of said second one of said pair of diodes being connected to said first terminal of said transistor means.

12. The apparatus of claim 9, wherein said means for providing a pair of square wave signals comprises a pair of flip-flops.

* * * * *